(12) United States Patent
Jeng et al.

(10) Patent No.: US 10,354,988 B2
(45) Date of Patent: Jul. 16, 2019

(54) USING METAL-CONTAINING LAYER TO REDUCE CARRIER SHOCK IN PACKAGE FORMATION

(71) Applicant: Taiwan Semiconductor Manufacturing Company, Ltd., Hsinchu (TW)

(72) Inventors: Shin-Puu Jeng, Hsinchu (TW); Hsien-Wen Liu, Hsinchu (TW); Yi-Jou Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/139,660

(22) Filed: Sep. 24, 2018

(65) Prior Publication Data

US 2019/0027469 A1 Jan. 24, 2019

Related U.S. Application Data

(63) Continuation of application No. 15/223,862, filed on Jul. 29, 2016, now Pat. No. 10,083,949.

(51) Int. Cl.
*H01L 25/00* (2006.01)
*H01L 21/683* (2006.01)
(Continued)

(52) U.S. Cl.
CPC ............ *H01L 25/50* (2013.01); *H01L 21/288* (2013.01); *H01L 21/568* (2013.01); *H01L 21/6835* (2013.01); *H01L 21/76802* (2013.01); *H01L 21/76874* (2013.01); *H01L 21/76879* (2013.01); *H01L 21/76885* (2013.01); *H01L 23/3128* (2013.01); *H01L 23/5389* (2013.01); *H01L 24/18* (2013.01); *H01L 25/0657* (2013.01);
(Continued)

(58) Field of Classification Search
CPC ...... H01L 25/50; H01L 21/288; H01L 21/568
See application file for complete search history.

(56) References Cited

U.S. PATENT DOCUMENTS 8,361,842 B2 1/2013 Yu et al.
8,680,647 B2 3/2014 Yu et al.
(Continued)

FOREIGN PATENT DOCUMENTS

JP 2013258238 A 12/2013
JP 2016009635 A 1/2016

*Primary Examiner* — Errol V Fernandes
(74) *Attorney, Agent, or Firm* — Slater Matsil, LLP

(57) ABSTRACT

A method includes forming a dielectric layer over a radiation de-bondable coating. The radiation de-bondable coating is over a carrier, and the radiation de-bondable coating includes metal particles therein. Metal posts are formed over the dielectric layer. A device die is attached to the dielectric layer. The device die and the metal posts are encapsulated in an encapsulating material. A plurality of redistribution lines is formed on a first side of the encapsulating material, and is electrically coupled to the device die and the metal posts. The carrier is de-bonded by projecting a radiation source on the radiation de-bondable coating to decompose the radiation de-bondable coating. Electrical connections are formed on a second side of the encapsulating material. The electrical connections are electrically coupled to the metal posts.

20 Claims, 25 Drawing Sheets

(51) Int. Cl.
  *H01L 21/768* (2006.01)
  *H01L 21/56* (2006.01)
  *H01L 21/288* (2006.01)
  *H01L 25/065* (2006.01)
  *H01L 23/538* (2006.01)
  *H01L 23/00* (2006.01)
  *H01L 25/10* (2006.01)
  *H01L 23/31* (2006.01)

(52) U.S. Cl.
  CPC .. *H01L 25/105* (2013.01); *H01L 2221/68345* (2013.01); *H01L 2221/68359* (2013.01); *H01L 2221/68381* (2013.01); *H01L 2224/04105* (2013.01); *H01L 2224/12105* (2013.01); *H01L 2224/32145* (2013.01); *H01L 2224/32225* (2013.01); *H01L 2224/48227* (2013.01); *H01L 2224/73265* (2013.01); *H01L 2224/73267* (2013.01); *H01L 2224/92244* (2013.01); *H01L 2225/0651* (2013.01); *H01L 2225/0652* (2013.01); *H01L 2225/06548* (2013.01); *H01L 2225/06572* (2013.01); *H01L 2225/1035* (2013.01); *H01L 2225/1058* (2013.01); *H01L 2924/15311* (2013.01)

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,583,420 B2 | 2/2017 | Lin et al. | |
| 9,659,805 B2 | 5/2017 | Hu et al. | |
| 9,685,411 B2 | 6/2017 | Chen | |
| 9,691,708 B1 | 6/2017 | Huang et al. | |
| 9,735,131 B2 | 8/2017 | Su et al. | |
| 9,754,928 B2 | 9/2017 | Chen et al. | |
| 9,761,522 B2 | 9/2017 | Chu et al. | |
| 9,773,757 B2 | 9/2017 | Yu et al. | |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0021583 A1 | 1/2014 | Lo et al. | |
| 2014/0134797 A1 | 5/2014 | Chi et al. | |
| 2014/0183731 A1 | 7/2014 | Lin et al. | |
| 2014/0203429 A1 | 7/2014 | Yu et al. | |
| 2014/0225222 A1 | 8/2014 | Yu et al. | |
| 2014/0252646 A1* | 9/2014 | Hung | H01L 23/481 257/774 |
| 2014/0264930 A1 | 9/2014 | Yu et al. | |
| 2014/0367160 A1 | 12/2014 | Yu et al. | |
| 2016/0163566 A1 | 6/2016 | Chen et al. | |
| 2017/0103957 A1* | 4/2017 | Li | H01L 24/14 |

* cited by examiner

US 10,354,988 B2

USING METAL-CONTAINING LAYER TO REDUCE CARRIER SHOCK IN PACKAGE FORMATION

This application is a continuation of U.S. patent application Ser. No. 15/223,862, filed on Jul. 29, 2016, and entitled "Using Metal-Containing Layer to Reduce Carrier Shock in Package Formation," hereby incorporated by reference herein as if reproduced in its entirety.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
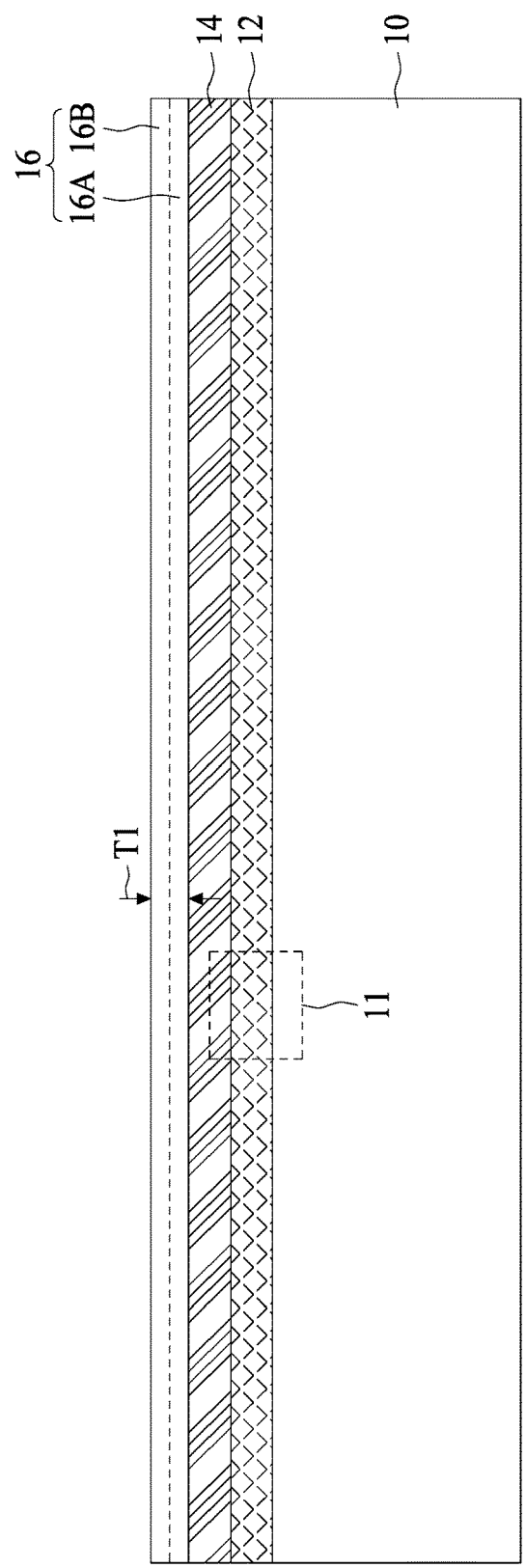
FIGS. 1 through 11 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Package-on-Package (PoP) structure and the method of forming the package are provided in accordance with various exemplary embodiments. The variations of the embodiments are discussed. Throughout the various views and illustrative embodiments, like reference numbers are used to designate like elements.

Figure 25:
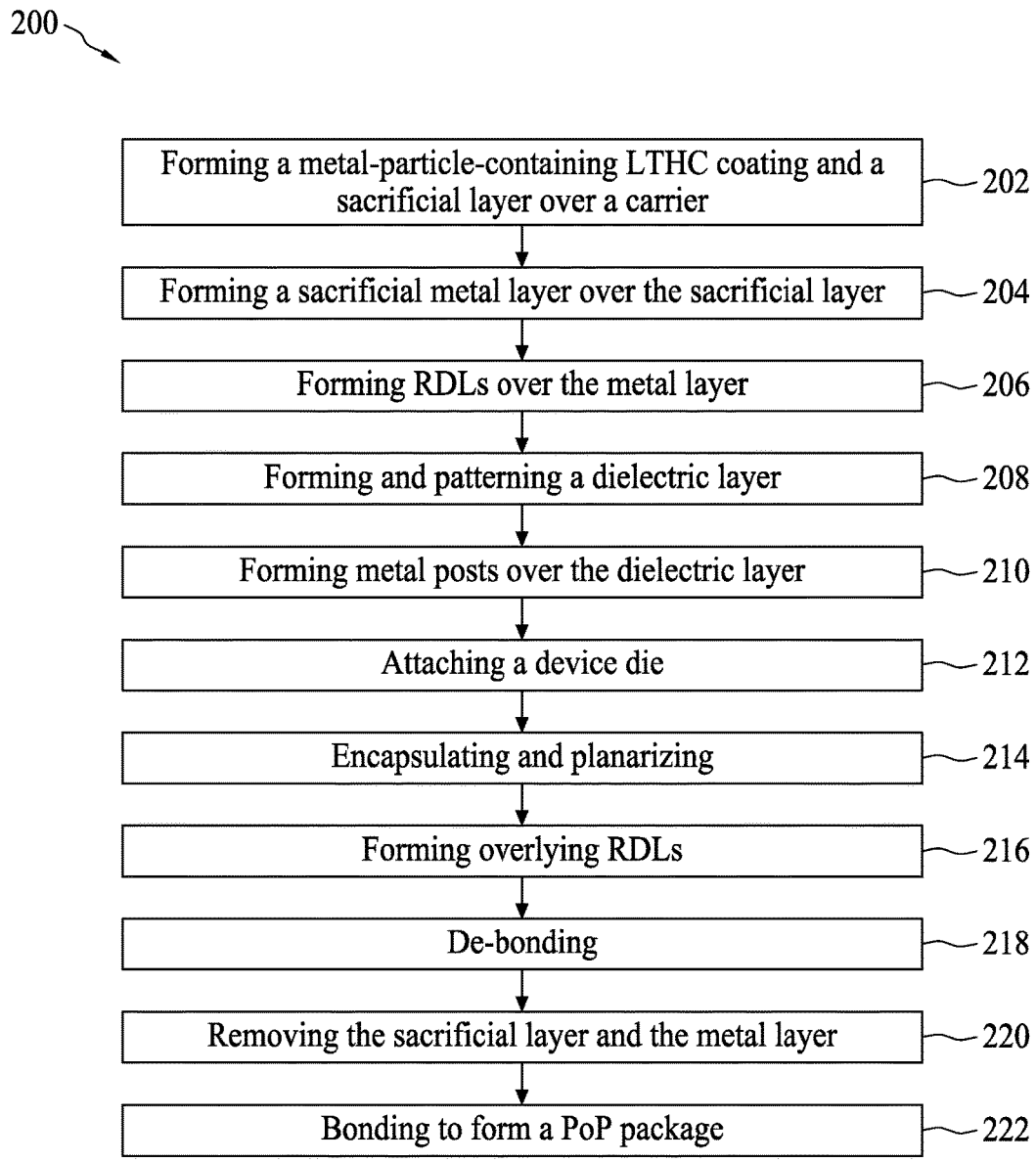
FIG. 25 illustrates a process flow for forming a package in accordance with some embodiments.

FIGS. 1 through 11 illustrate the cross-sectional views of intermediate stages in the formation a PoP package in accordance with some embodiments. The steps shown in FIG. 1 through 11 are also illustrated schematically in the process flow 200 as shown in FIG. 25.

FIG. 1 illustrates carrier 10 and layer 12. Carrier 10 may be a glass carrier, a ceramic carrier, or the like. Carrier 10 may have a round top-view shape, and may have a top-view shape and size of a silicon wafer. For example, carrier 10 may have an 8-inch diameter, a 12-inch diameter, or the like. Layer 12 is formed over carrier 10, and may be a radiation de-bondable film/coating, which may be decomposed and thus de-bonded under the heat of radiation. In accordance with some embodiments, layer 12 is formed of a Light To Heat Conversion (LTHC) material, which can be removed along with carrier 10 from the overlying structures that will be formed in subsequent steps. Layer 12 is coating on carrier 10. The respective step is illustrated as step 202 in the process flow shown in FIG. 25. Accordingly, layer 12 is referred to as an LTHC coating hereinafter. In accordance with some embodiments of the present disclosure, LTHC coating 12 includes carbon black (carbon particles), a solvent, a silicon filler, and/or an epoxy.

Figure 24:
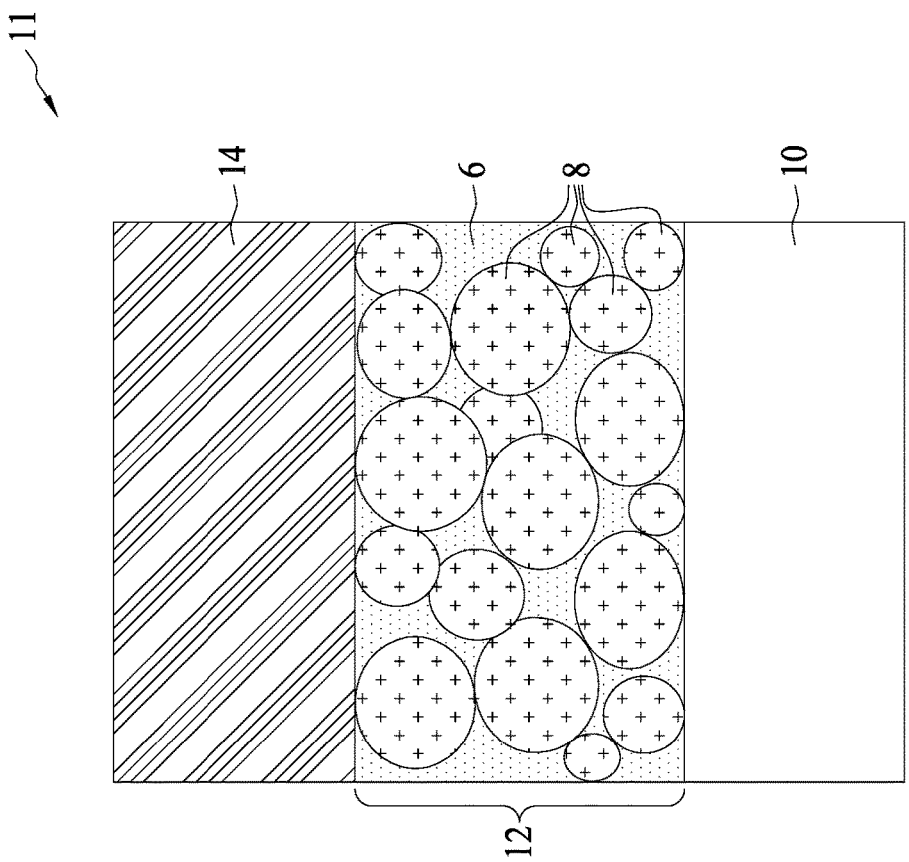
FIG. 24 illustrates an amplified view of a portion of a Light To Heat Conversion (LTHC) coating in accordance with some embodiments.

FIG. 1 illustrates region 11, which includes a portion of LTHC coating 12. A schematic amplified view of region 11 is shown in FIG. 24. In accordance with some embodiments, LTHC coating 12 includes a metal powder, which is distributed in base material 6 and shown as metal particles 8. Base material 6 may include the solvent, the silicon filler, and the epoxy. Metal particles 8 may be formed of aluminum, copper, tungsten, nickel, or the like, which has a high thermal conductivity. Metal particles 8 may be formed of substantially pure metal (for example, with a weight percentage greater than about 95 percent or higher), and are not in the form of an oxide(s), carbides, nitrides, or the like. Metal particles 8 may have a volume percentage between about 10 percent and about 60 percent, although more or less metal particles 8 may be incorporated in LTHC coating 12. In accordance with some embodiments, metal particles 8 have a great enough volume percentage so that they are essentially interconnected continuously throughout LTHC coating 12 for efficient heat transfer, rather than forming discrete islands.

In accordance with some embodiments, metal particles 8, which are in the form of metal powder, are mixed into an existing LTHC material, which is the base material 6 as shown in FIG. 24, to generate a new LTHC material, which is coated on carrier 10.

In the formation of the PoP package (for example, package 70 in FIG. 11), there is a plurality of thermal processes. Due to the difference in materials and temperature variation in different parts, different regions of carrier 10 may have different temperatures. Furthermore, carrier 10, which may be formed of glass, has a high Coefficient of Thermal Expansion (CTE), and expands or shrinks significantly in response to temperature change. The difference in the temperatures of different parts of carrier 10 thus may cause thermal shock on carrier 10, resulting in chipping or cracking. Advantageously, by incorporating metal particles 8 in LTHC coating 12, the thermal conductivity of LTHC coating 12 is improved, and can help dissipate heat around to achieve a more uniform heat distribution for carrier 10. The thermal shock suffered by carrier 10 is reduced. Furthermore, when metal particles 8 are interconnected, the heat dissipating ability is significantly improved. In accordance with other embodiments, metal particles 8 are formed as discrete particles and/or particle groups, which form discrete islands separated from each other by base material 6.

In accordance with alternative embodiments, LTHC coating 12 does not include metal particles. LTHC coating 12 in accordance with these embodiments may include carbon black, silicon particles, a solvent, an epoxy, and may or may not include metal oxide particles.

Referring back to FIG. 1, layer 14 is formed on LTHC coating 12. The respective step is also illustrated as step 202 in the process flow shown in FIG. 25. Layer 14 is a sacrificial layer in accordance with some embodiments, and may be referred to as sacrificial layer 14. In accordance with some embodiments of the present disclosure, layer 14 is formed of a polymer, which may also be a photo-sensitive material such as polybenzoxazole (PBO), polyimide, benzocyclobutene (BCB), or the like. Accordingly, layer 14 may be patterned through light-exposure and development. Sacrificial layer 14 is a blanket layer that is not patterned, and has a planar top surface.

Next, metal layer 16, which may also be a sacrificial layer, is formed over sacrificial layer 14 in a blanket deposition step. The respective step is illustrated as step 204 in the process flow shown in FIG. 25. In accordance with some embodiments of the present disclosure, metal layer 16 has a composite structure, which may include titanium layer 16A and copper layer 16B over titanium layer 16A. In accordance with some other embodiments, metal layer 16 is formed of a single homogenous material, which may include aluminum, copper, aluminum copper, titanium, or alloys thereof. Metal layer 16, similar to metal-containing LTHC coating 12, also has the function of redistributing heat in the packaging process. To improve the efficiency, the thickness T1 of metal layer 16 may be great enough to achieve satisfactory heat-redistribution ability. Thickness T1 may be greater than the thickness of typical seed layer used in plating. In accordance with some embodiments, thickness T1 is greater than about 0.5 µm. Metal layer 16 may be formed using, for example, Physical Vapor Deposition (PVD).

Figure 2:
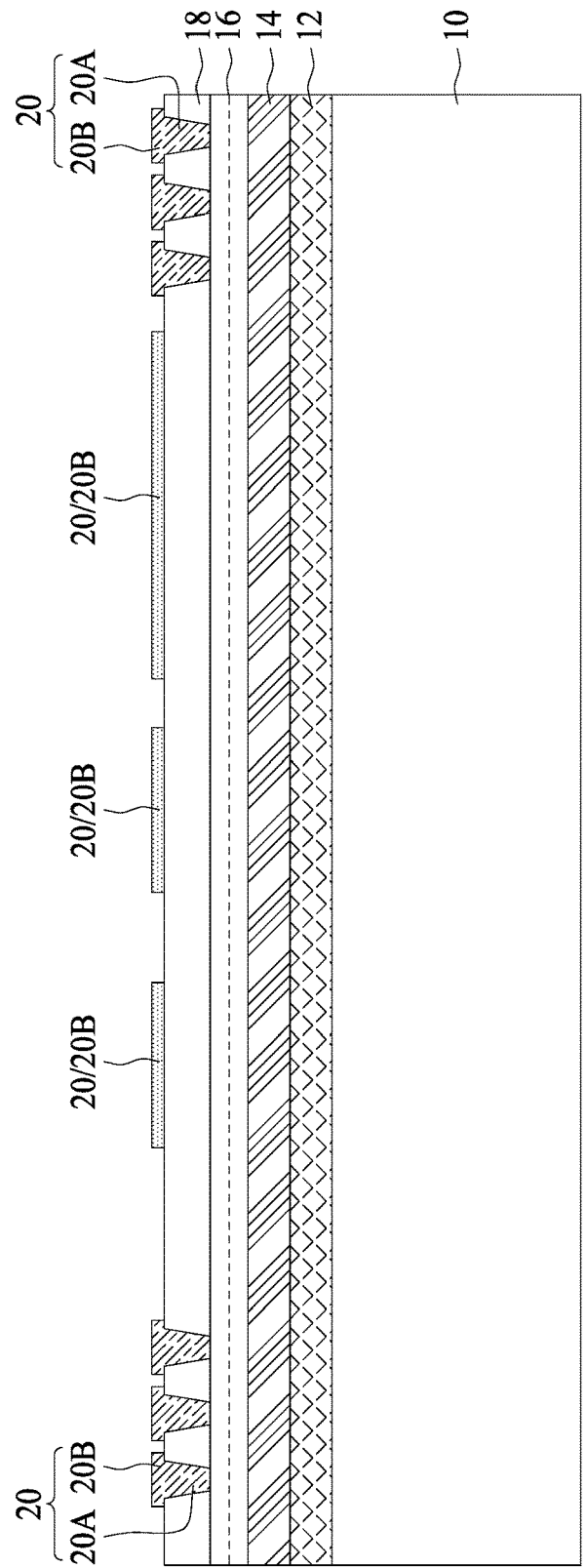

FIG. 2 illustrates the formation of dielectric layer 18 and Redistribution Lines (RDLs) 20. Dielectric layer 18 is first formed over metal layer 16. Dielectric layer 18 may be formed of a material different from, or same as, the material of dielectric layer 14. In accordance with some embodiments, dielectric layer 18 is formed of an organic material such as a polymer, which may be PBO or polyimide. In accordance with alternative embodiments, dielectric layer 18 is formed of an inorganic material, for example, a nitride such as silicon nitride, an oxide such as silicon oxide, PhosphoSilicate Glass (PSG), BoroSilicate Glass (BSG), Boron-doped PhosphoSilicate Glass (BPSG), or the like. Dielectric layer 18 is patterned to form openings (occupied by RDLs 20), through which the underlying metal layer 16 is exposed.

Next, RDLs 20 are formed. The respective step is illustrated as step 206 in the process flow shown in FIG. 25. The formation process includes forming a blanket seed layer (not shown), forming a patterned mask (not shown) over the seed layer, and performing a metal plating to form RDLs 20. The seed layer includes portions over dielectric layer 18 and portions extending into the openings in dielectric layer 18 to contact metal layer 16. The patterned mask layer may be formed of a photo resist. In accordance with some embodiments, the seed layer includes a titanium layer and a copper layer over the titanium layer. In accordance with alternative embodiments, the seed layer includes a single copper layer or a single copper alloy layer. The seed layer may be formed using, for example, PVD. In the formation of RDLs 20, metal layer 16 is not used as a seed layer. The plating may be performed using, for example, electro-less plating. The plated material may include copper or a copper alloy. After the plating, the patterned mask is removed. The portions of the seed layer previously covered by the removed patterned mask are then removed in an etching step, leaving RDLs 20 as in FIG. 2. RDLs 20 include via portions 20A in dielectric layer 18, and trace portions 20B over dielectric layer 18.

Figure 3:
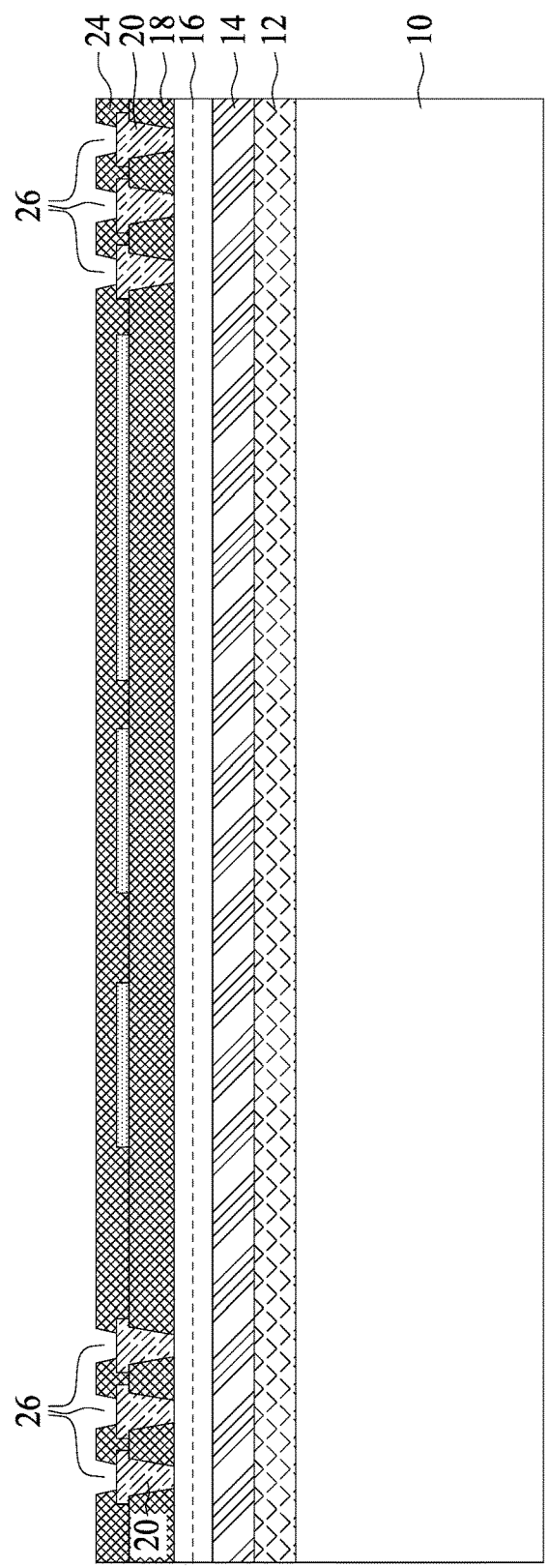

Referring to FIG. 3, dielectric layer 24 is formed and then patterned. The respective step is illustrated as step 208 in the process flow shown in FIG. 25. Dielectric layer 24 may (or may not) be formed of a material selected from the same group of candidate materials for forming dielectric layers 14 and/or 18, and may be formed of a polymer or an inorganic material. Dielectric layer 24 is then patterned, and some portions of RDLs 20 are exposed. Openings 26 are formed as a result of the patterning.

Figure 4:
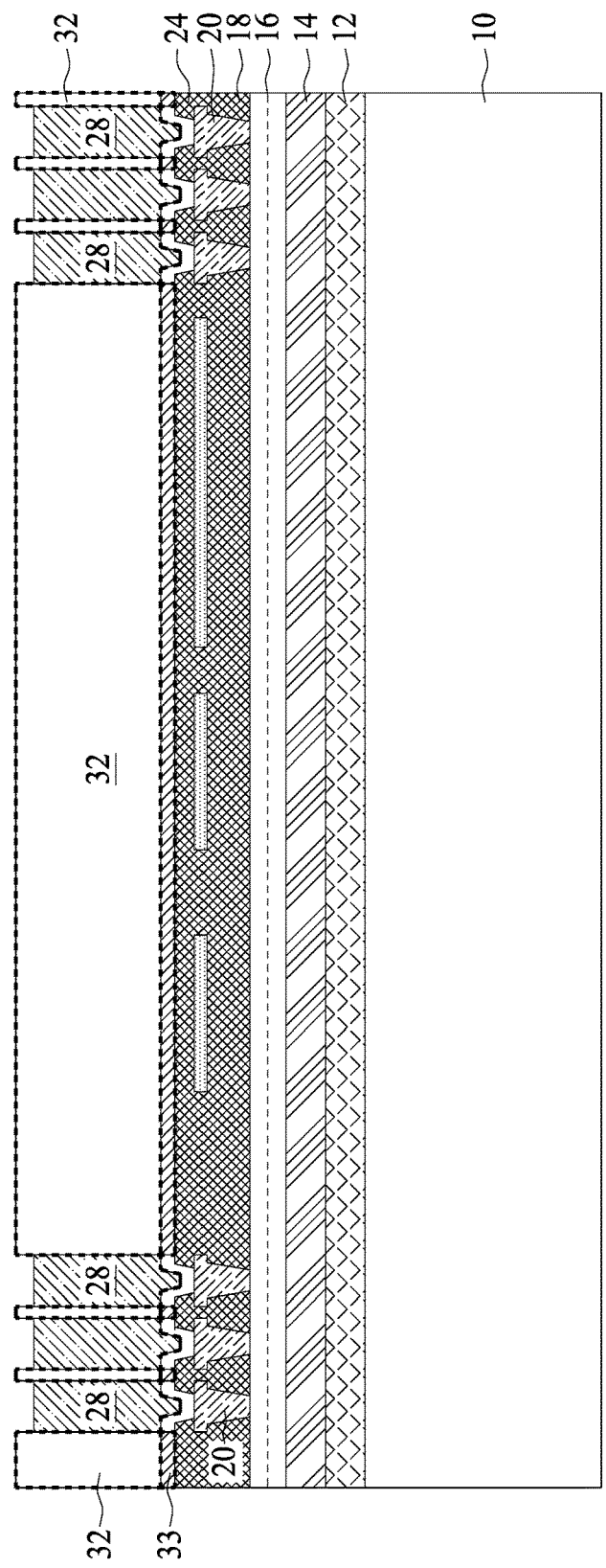

FIG. 4 illustrates the formation of metal posts 28. The respective step is illustrated as step 210 in the process flow shown in FIG. 25. Referring to FIG. 4, metal seed layer 33 is formed, and extends into openings 26 (FIG. 3). Patterned mask 32, which may be formed of a photo resist, is formed over metal seed layer 33 and patterned, so that some portions of seed layer 33 are exposed. A plating step is then performed to form metal posts 28. After the plating, patterned mask 32 is removed, followed by the removal of the portions of seed layer 33 previously covered by patterned mask 32. Throughout the description, the remaining portions of seed layer 33 are construed as parts of metal posts 28.

Figure 5:
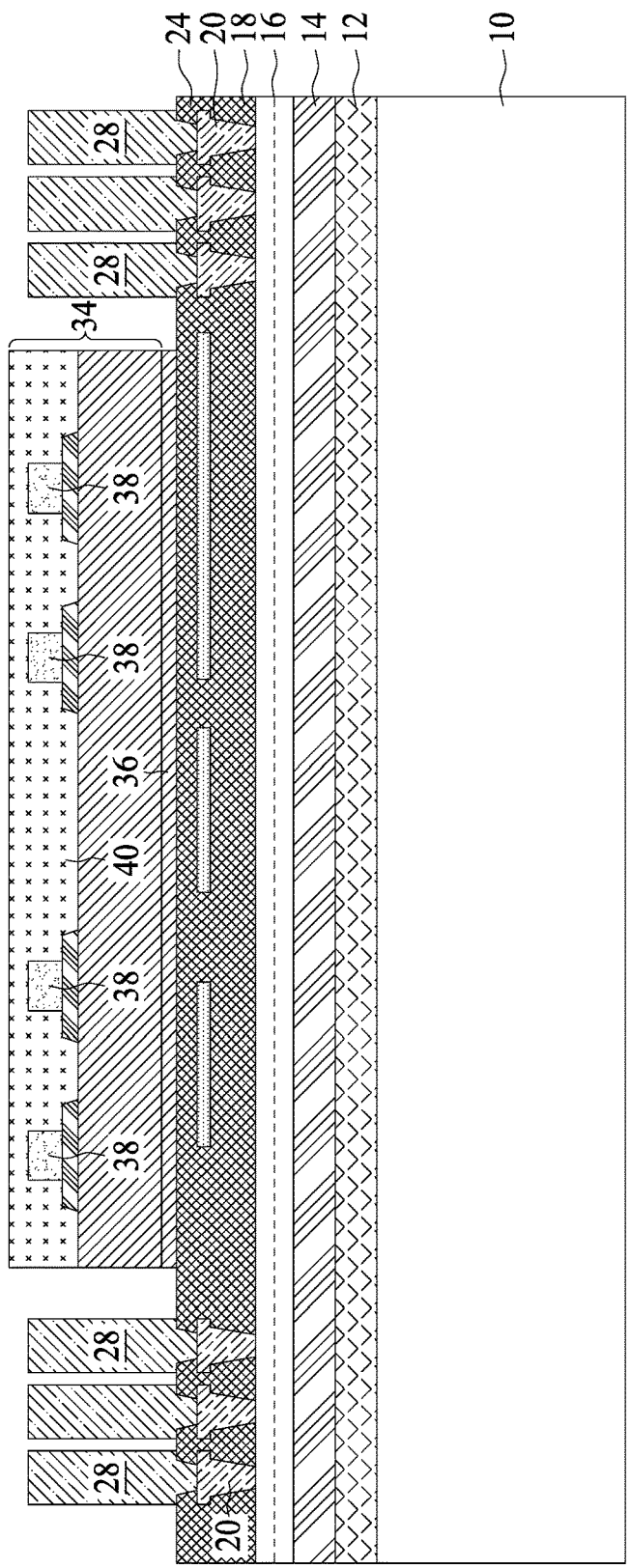

FIG. 5 illustrates the attachment of device die 34 over dielectric layer 24. The respective step is illustrated as step 212 in the process flow shown in FIG. 25. Device die 34 may be adhered to dielectric layer 24 through die-attach film 36. The edges of die-attach films 36 are co-terminus with (vertically aligned to) the corresponding edges of the respective device die 34. Die-attach films 36 are adhesive films. Although one device die 34 is illustrated, there is a plurality of device dies identical to device die 34 placed in this step. The plurality of placed device dies may be arranged as an array including a plurality of rows and a plurality of columns. Device die 34 may include a semiconductor substrate having a back surface (the surface facing down) in physical contact with the respective underlying die-attach film 36. Device die 34 further includes integrated circuit devices (such as active devices, which include transistors, not shown) at the front surface (the surface facing up) of the semiconductor substrates. Device die 34 may be a logic die such as a Central Processing Unit (CPU) die, a Graphic Processing Unit (GPU) die, a mobile application die, or the like. In accordance with some exemplary embodiments, Device die 34 includes metal pillars 38 connected to the integrated circuit devices, and dielectric layer 40 covering and/or encircling metal pillars 38. Metal pillars 38 may be copper pillars in accordance with some embodiments. Dielectric layer 40 may be formed of a polymer such as polyimide or PBO.

Figure 6:
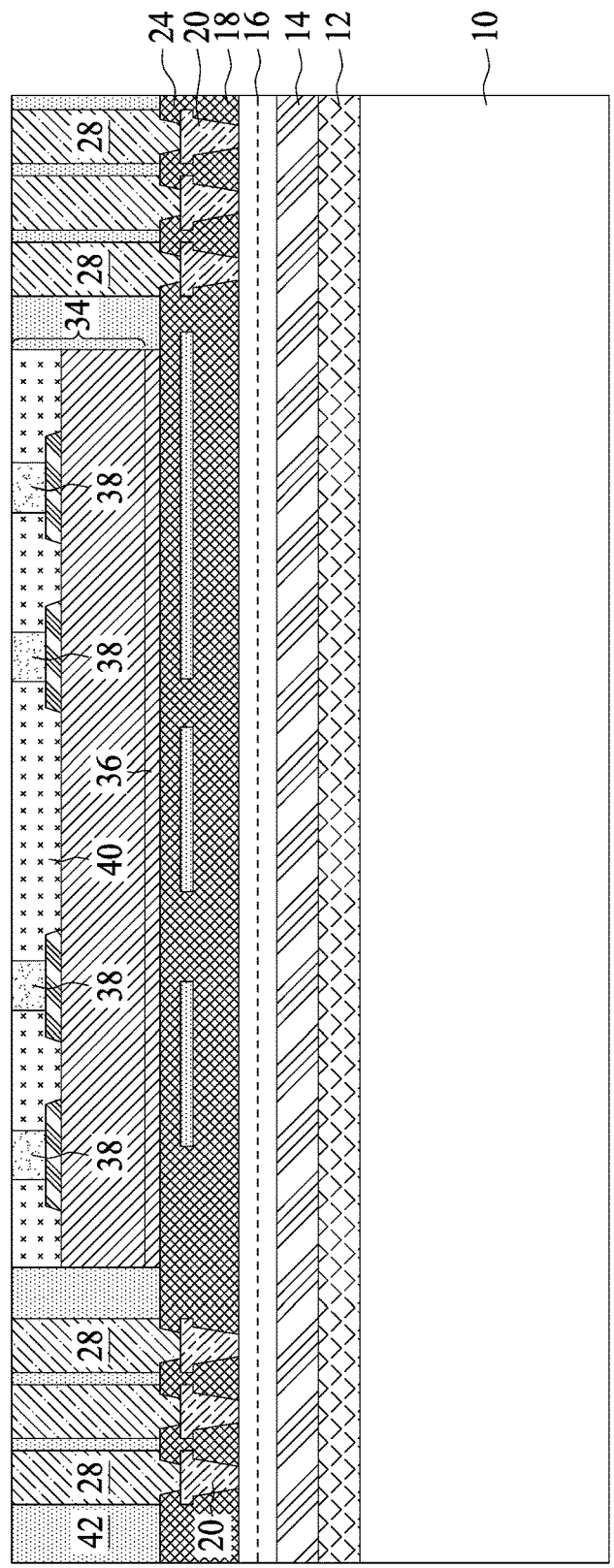

Next, an encapsulation is performed, and device die 34 is encapsulated in encapsulating material 42, as shown in FIG. 6. The respective step is illustrated as step 214 in the process flow shown in FIG. 25. Encapsulating material 42 may be a molding compound, a molding underfill, an epoxy, and/or a resin. Encapsulating material 42 fills the gaps between neighboring metal posts 28 and the gaps between metal posts 28 and device die 34. The top surface of encapsulating material 42 is higher than the top ends of metal posts 28.

Next, a planarization step such as a Chemical Mechanical Polish (CMP) or a mechanical grinding is performed to thin encapsulating material 42, until metal posts 28 and metal pillars 38 are exposed. The resulting structure is shown in FIG. 6. Due to the planarization, the top ends of metal posts 28 are substantially level (coplanar) with the top surface of encapsulating material 42 and the top surfaces of metal pillars 38.

Figure 7:
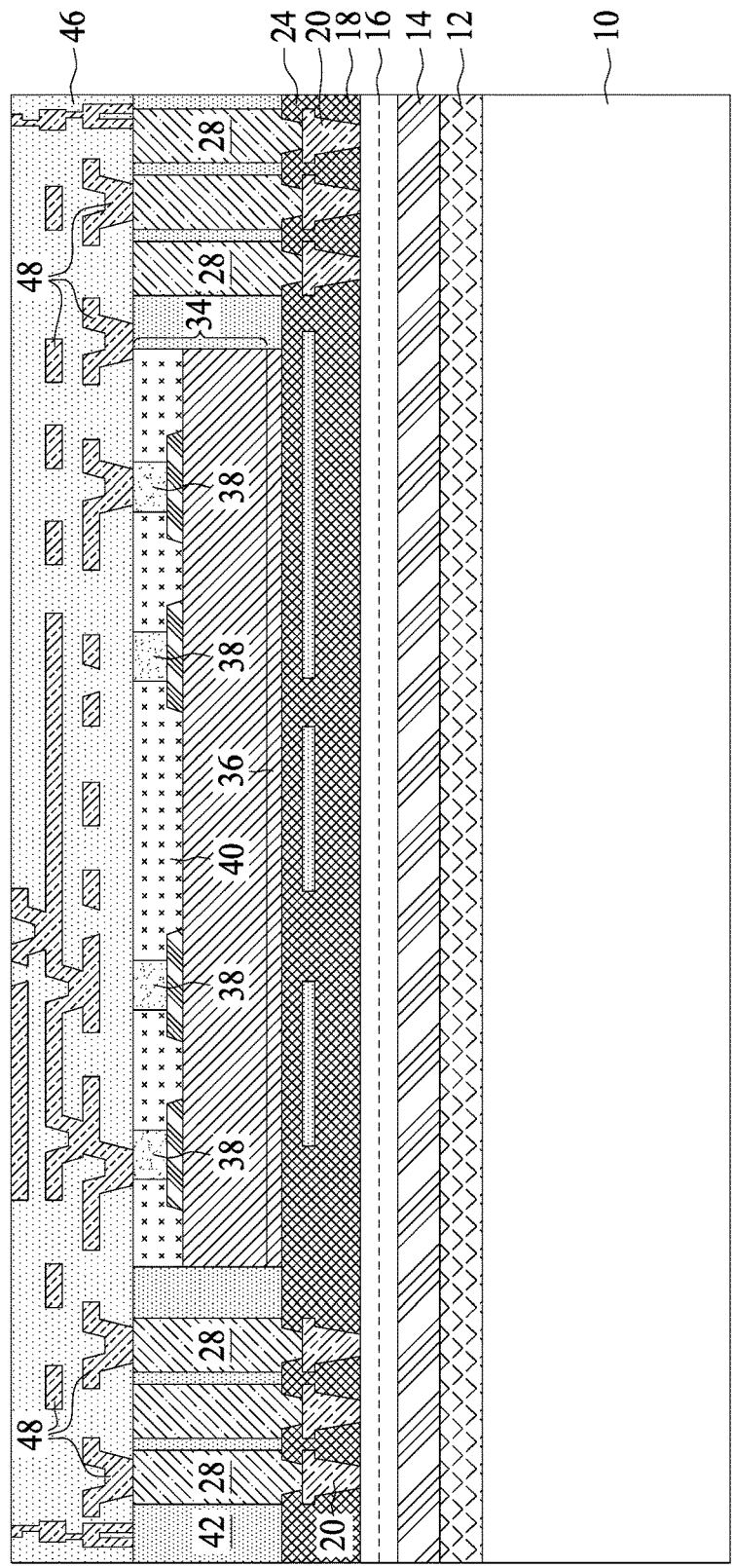

Referring to FIG. 7, one or more dielectric layer(s) 46 and the respective RDLs 48 are formed over encapsulating material 42, metal posts 28, and metal pillars 38. The respective step is illustrated as step 216 in the process flow shown in FIG. 25. In accordance with some embodiments of the present disclosure, dielectric layers 46 are formed of a polymer(s) such as PBO, polyimide, or the like. In accordance with alternative embodiments of the present disclosure, dielectric layers 46 are formed of an inorganic dielectric material(s) such as silicon nitride, silicon oxide, silicon oxynitride, or the like.

RDLs 48 are formed in dielectric layers 46 to electrically couple to metal pillars 38 and metal posts 28. RDLs 48 may also interconnect metal pillars 38 and metal posts 28 with each other. RDLs 48 may include metal traces (metal lines) and vias underlying and connected to the metal traces. In accordance with some embodiments of the present disclosure, RDLs 48 are formed through plating processes, wherein each of RDLs 48 includes a seed layer (not shown) and a plated metallic material over the seed layer. The formation of each layer of RDLs 48 may be similar to the formation of RDLs 20.

Figure 8:
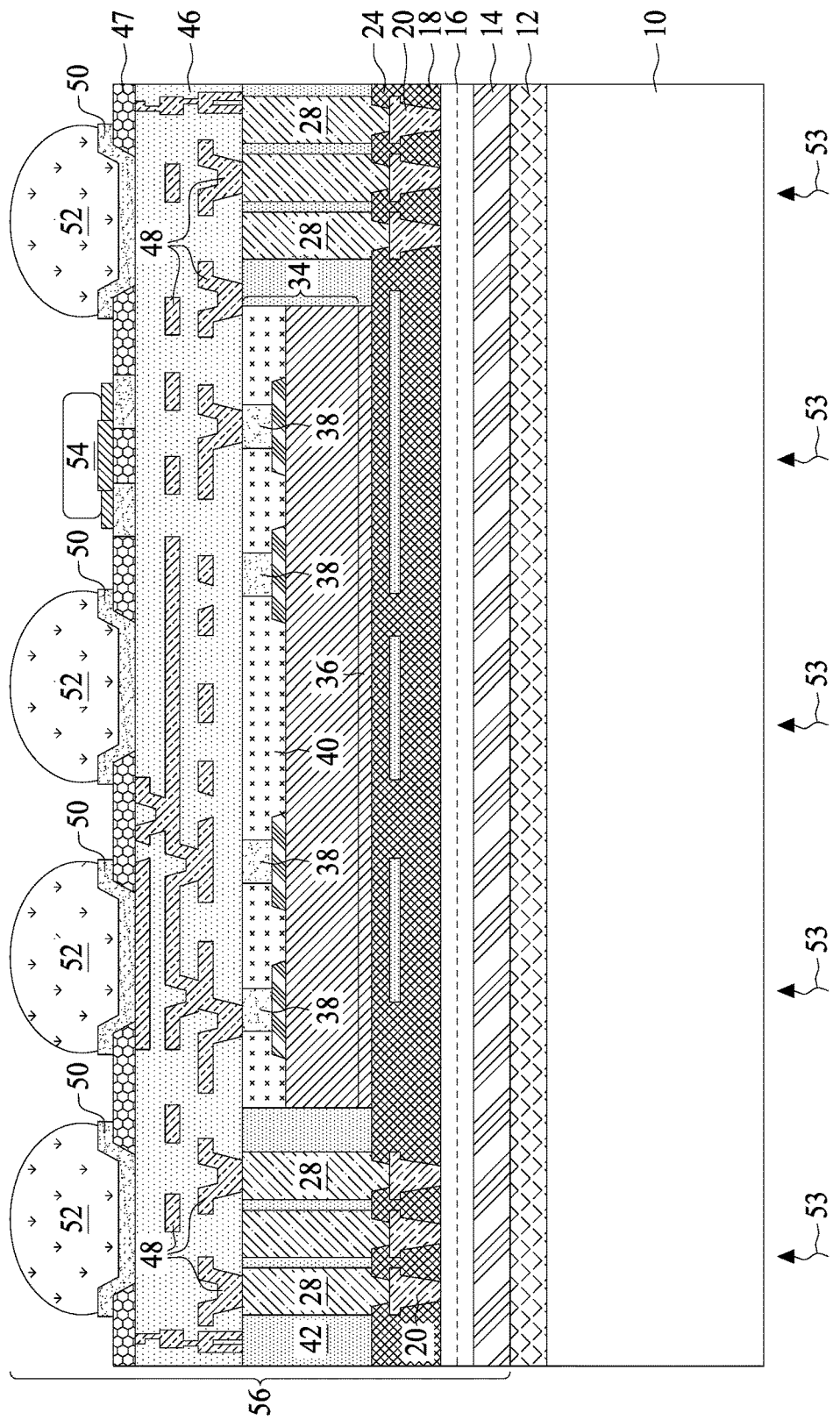

FIG. 8 illustrates the formation of Under-Bump Metallurgies (UBM) 50 and electrical connectors 52 in accordance with some exemplary embodiments of the present disclosure. Electrical connectors 52 are electrically coupled to RDLs 48, metal pillars 38, and/or metal posts 28. The formation process may include forming top dielectric layer 47 over RDLs 48, and then patterning top dielectric layer 47 to expose the metal pads of RDLs 48. UBMs 50 are then formed to extend into top dielectric layer 47. Solder balls may be placed over UBMs 50, and then reflowed to form solder regions 52. In accordance with alternative embodiments of the present disclosure, the formation of electrical connectors 52 includes performing a plating step to form solder regions over RDLs 48 and then reflowing the solder regions. Electrical connectors 52 may also include metal pillars, or metal pillars and solder caps, which may also be formed through plating.

As also shown in FIG. 8, passive device 54 (which may represent a plurality of passive devices) is also bonded to RDLs 48. The bonded passive devices (such as passive device 54) may include capacitors, resistors, inductors, or the like, and may be discrete devices in which no active devices such as transistors and diodes are formed. Throughout the description, the combined structure including dielectric layer 14, metal layer 16, device die(s) 34, metal posts 28, encapsulating material 42, RDLs 48, dielectric layers 46, and the overlying features are referred to as package 56, which may be a composite wafer.

Figure 9:
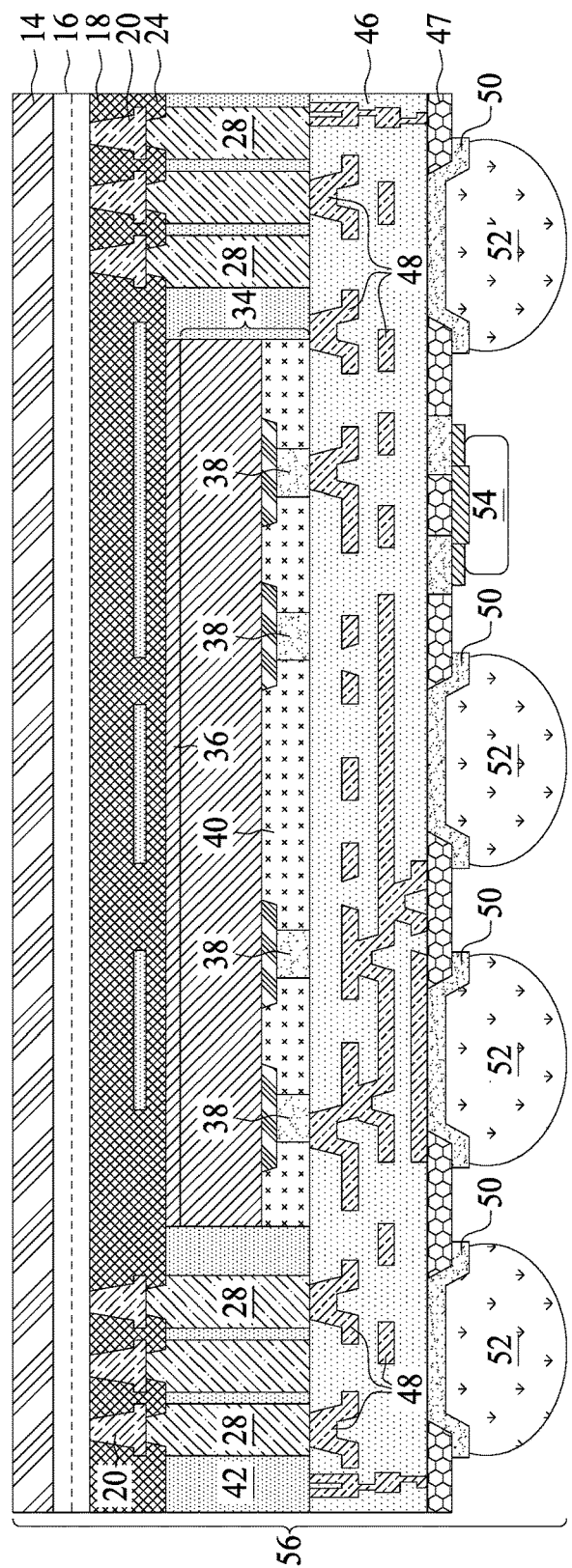

Next, package 56 is de-bonded from carrier 10. The respective step is illustrated as step 218 in the process flow shown in FIG. 25. In accordance with some exemplary de-boding process, the de-bonding is performed, for example, by projecting radiation 53, which may be laser or a UV light on LTHC coating 12 through carrier 10. The heat generated from the light or laser causes LTHC coating 12 to decompose, and hence carrier 10 is detached from package 56. The resulting structure is shown in FIG. 9. Dielectric layer 14 is hence exposed.

Dielectric layer 14 is then removed, for example, in an etching step or a mechanical grinding step. The respective step is illustrated as step 220 in the process flow shown in FIG. 25. In accordance with some embodiments, the exposed metal layer 16 is fully removed to expose the vias of RDLs 20. The respective step is also illustrated as step 220 in the process flow shown in FIG. 25. The removal of metal layer 16 may be performed through etching or mechanical grinding also. In accordance with alternative embodiments, rather than fully removing metal layer 16, metal layer 16 is patterned in an etching step (using a patterned mask layer such as a photo resist, not shown). The remaining portions of metal layer 16 form an additional RDL layer, which includes metal traces and metal pads.

Figure 10:
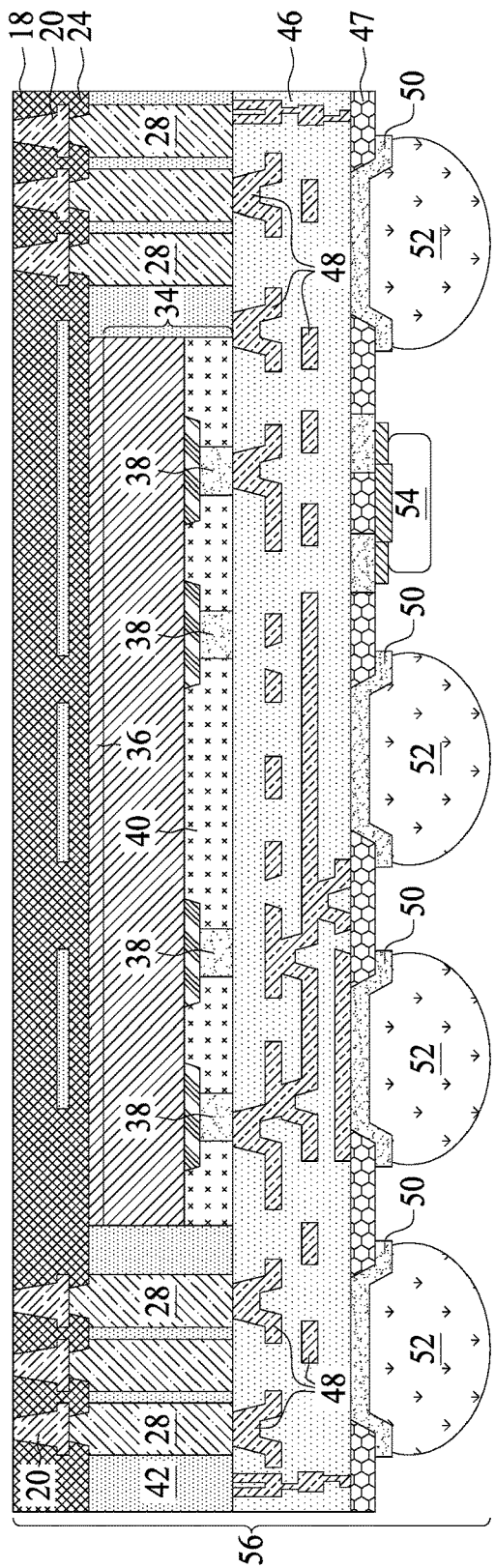
Figure 11:
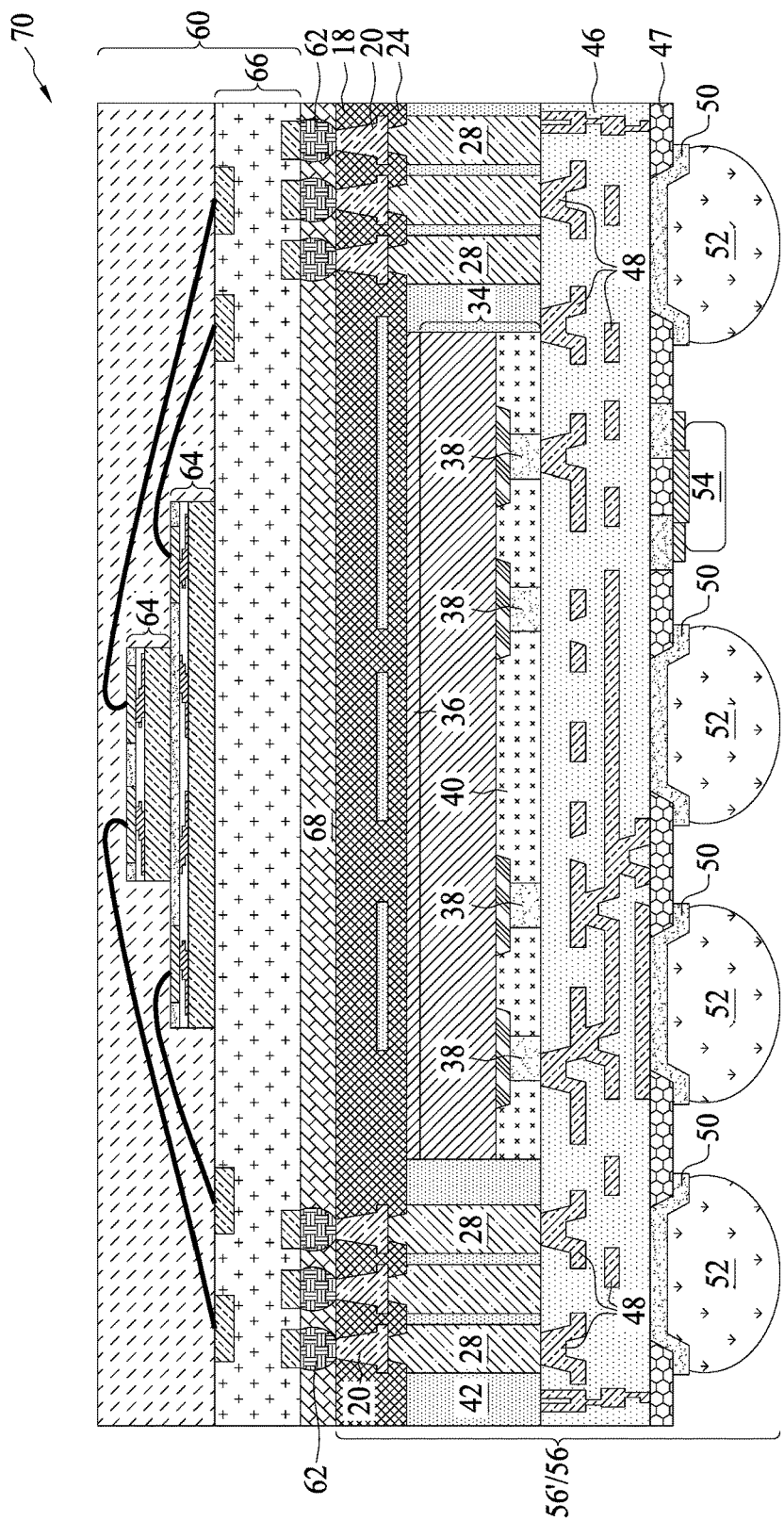

FIG. 10 illustrates the structure after dielectric layer 14 and metal layer 16 (FIG. 9) are removed. Next, package 60 is bonded to package 56, hence forming the PoP package 70 as shown in FIG. 11. The respective step is illustrated as step 222 in the process flow shown in FIG. 25. Although one package 60 is illustrated, there may be a plurality of packages identical to package 60 bonded to the underlying package 56. The bonding is performed through solder regions 62, which join RDLs 20 to the metal pads in the overlying package 60. In accordance with some embodiments of the present disclosure, package 60 includes device die(s) 64, which may be memory dies such as flash memory dies, Static Random Access Memory (SRAM) dies, Dynamic Random Access Memory (DRAM) dies, or the like. The memory dies may also be bonded to package substrate 66 in accordance with some exemplary embodiments.

After the bonding of package 60 to package 56, underfill 68 is disposed into the gap between package 60 and package 56. In subsequent steps, the package as shown in FIG. 11 is sawed apart into a plurality of packages, and one of the resulting PoP packages 70 is also illustrated in FIG. 11. Composite wafer 56 is sawed into a plurality of packages 56'. Packages 60 and 56' are also referred to as a top package and a bottom package, respectively, of the PoP package. In accordance with alternative embodiments, the sawing to separate the composite wafer 56 is performed first, and then the package 56' sawed from composite wafer 56 is bonded to top packages 60 to form PoP package 70.

FIGS. 12 through 18 and FIGS. 19 through 23 illustrate cross-sectional views of intermediate stages in the formation of PoP packages in accordance with some embodiments of the present disclosure. Unless specified otherwise, the materials and the formation methods of the components in these embodiments are essentially the same as the like components, which are denoted by like reference numerals in the embodiments shown in FIGS. 1 through 11. The details regarding the formation process and the materials of the components shown in FIGS. 12 through 23 may thus be found in the discussion of the embodiment shown in FIGS. 1 through 11.

Figure 12:
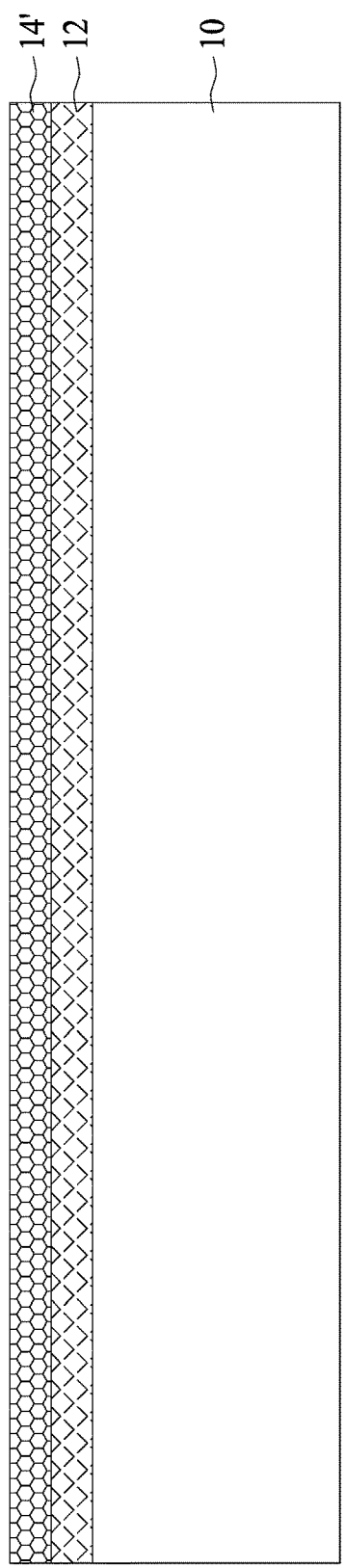
FIGS. 12 through 18 illustrate the cross-sectional views of intermediate stages in the formation of a package in accordance with some embodiments.

The embodiments shown in FIGS. 12 through 18 are similar to the embodiments shown in FIGS. 1 through 11, except metal layer 16 (FIG. 1) and the RDLs 20 (FIG. 11) are not formed. Referring to FIG. 12, LTHC coating 12 is formed over carrier 10. A portion of LTHC coating 12 is illustrated in FIG. 24, wherein metal particles 8 are incorporated in LTHC coating 12. Accordingly, the thermal conductivity of LTHC coating 12 is improved to reduce the thermal shock of carrier 10 in subsequent thermal processes of the packaging. Next, dielectric layer 14' is formed over LTHC coating 12. Dielectric layer 14' is a blanket layer in accordance with some embodiments.

Figure 13:
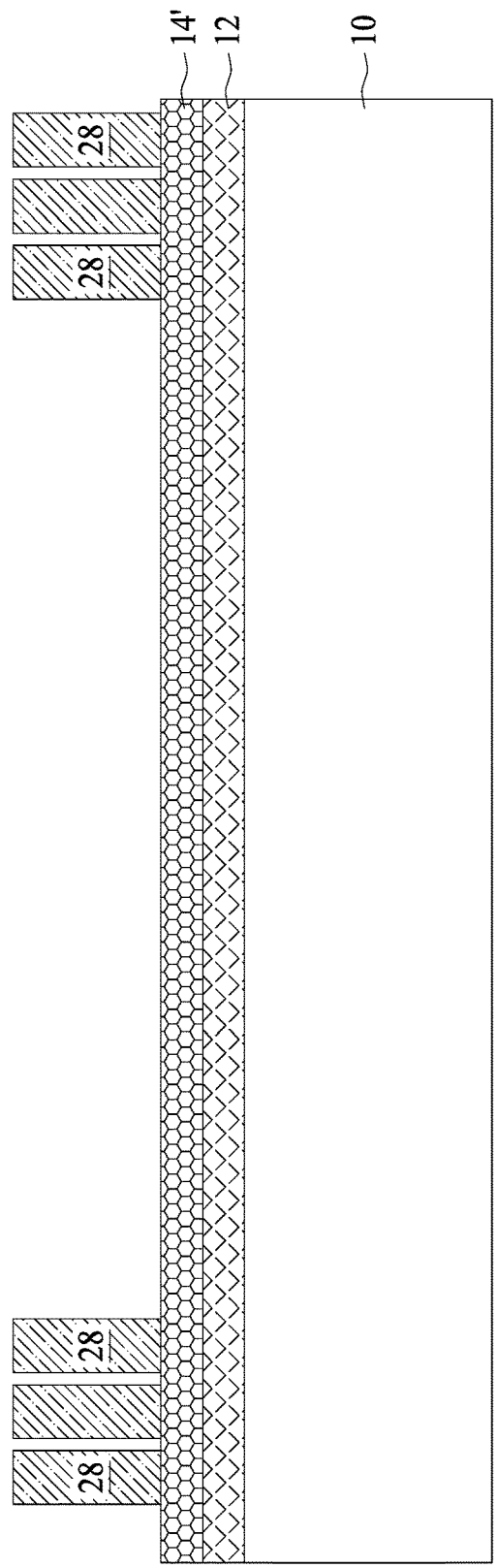
Figure 14:
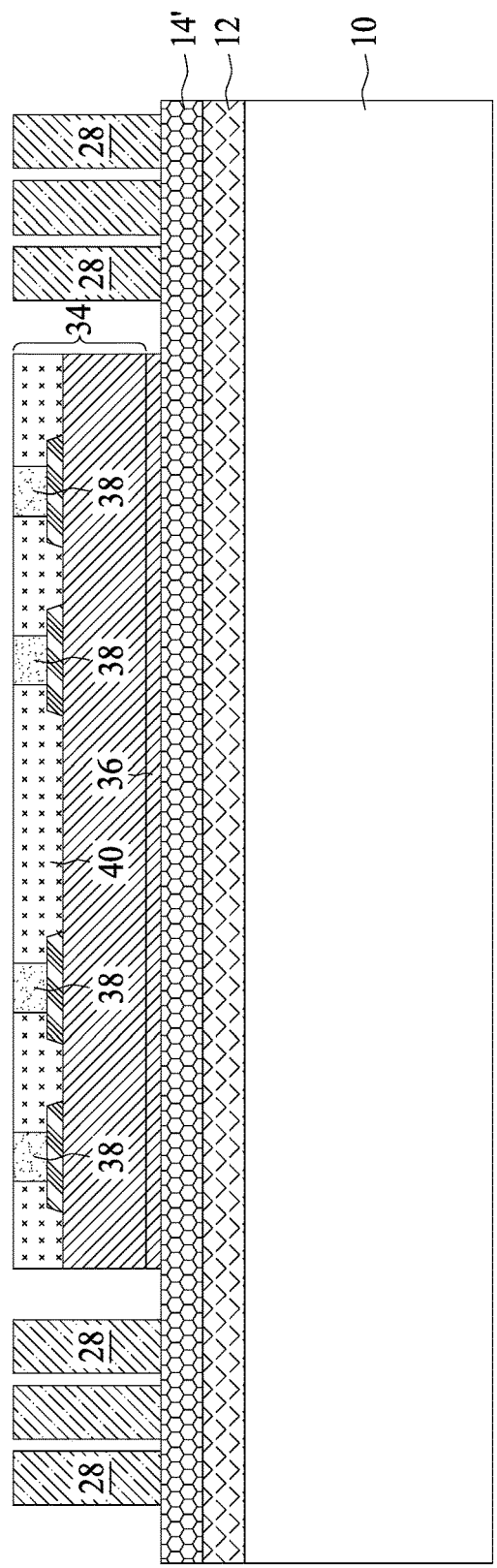

FIG. 13 illustrates the formation of metal posts 28, wherein the formation process includes depositing a metal seed layer (not shown), forming a patterned mask (not shown) such as a patterned photo resist, plating metal posts 28, removing the patterned mask, and etching the portions of the seed layer that are exposed due to the removal of the patterned mask. Next, as shown in FIG. 14, device die 34 is attached to dielectric layer 14' through die-attach film 36.

Figure 15:
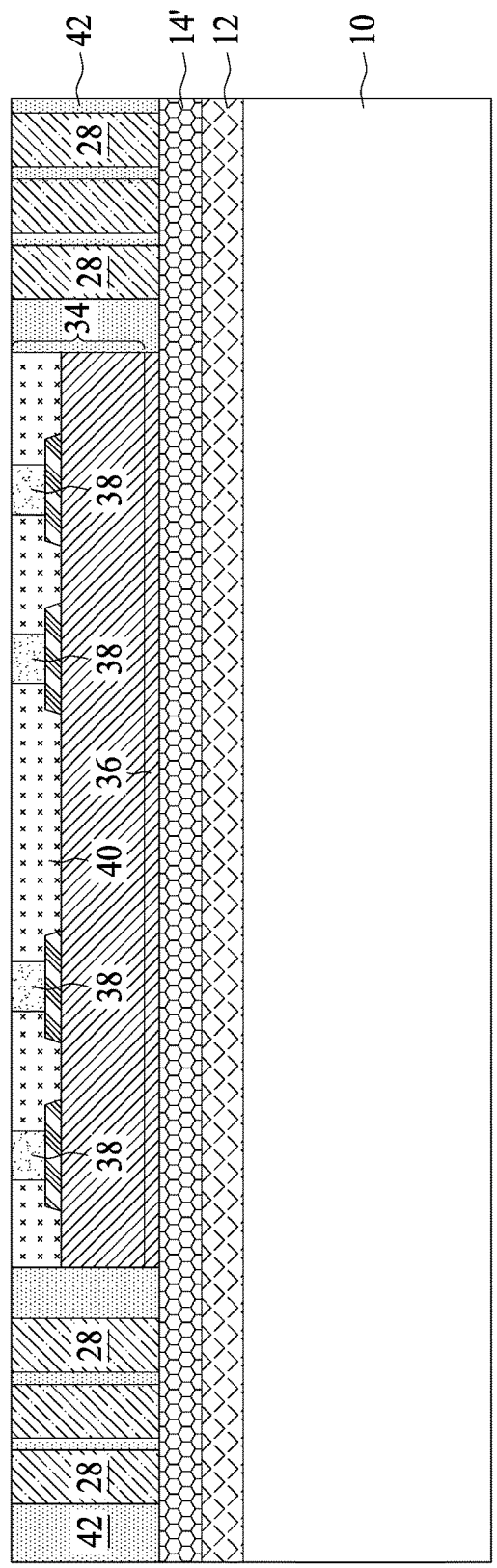
Figure 16:
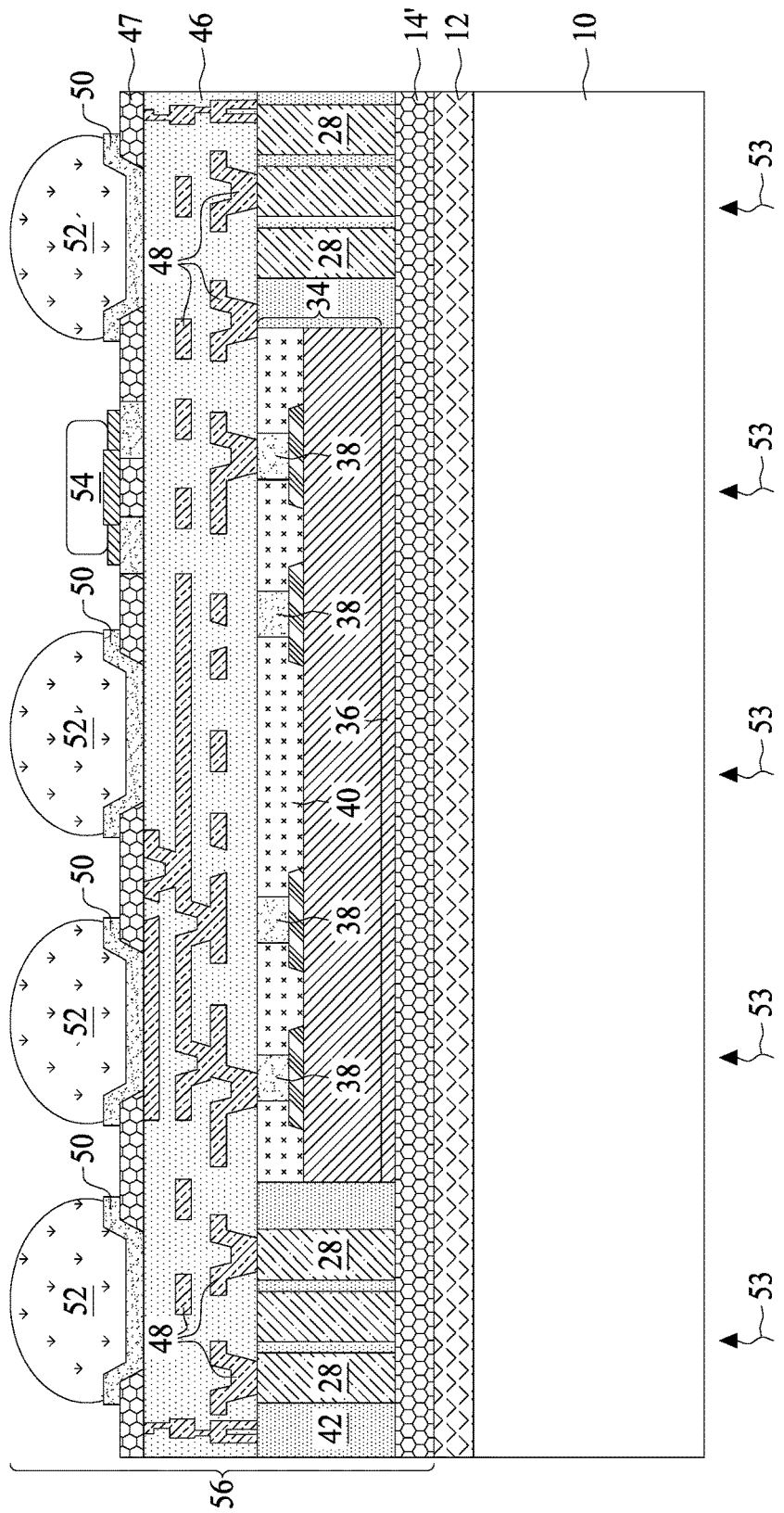

FIG. 15 illustrates the encapsulation of metal posts 28 and device die 34 in encapsulating material 42, followed by a planarization step to reveal metal pillars 38 and metal posts 28. In subsequent processes, as shown in FIG. 16, dielectric layers 46, RDLs 48, UBMs 50, and electrical connectors 52 are formed. Passive device 54 is also bonded to RDLs 48. Package 56, which may be a composite wafer, is thus formed.

Next, package 56 is de-bonded from carrier 10, for example, by using laser or a UV light 53 to decompose LTHC coating 12. The resulting structure is shown in FIG. 17, which is flipped upside down with relative to the orientation of FIG. 16.

Figure 17:
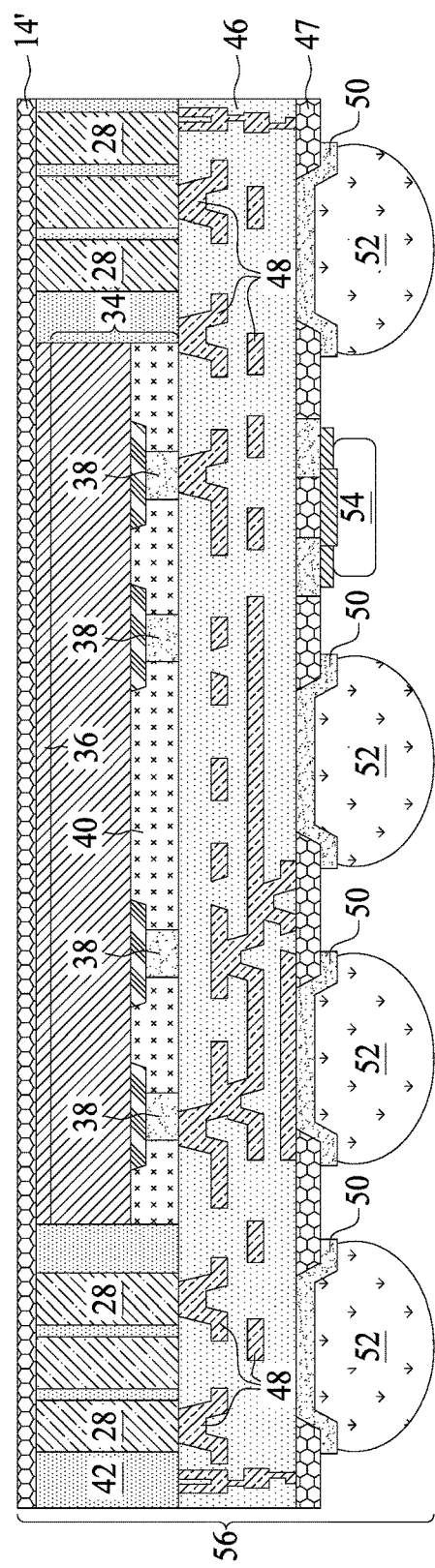

After the structure as shown in FIG. 17 is formed, openings (occupied by solder regions 62 in FIG. 18) are formed in dielectric layer 14'. For example, dielectric layer 14' may be patterned using laser drill to remove the portions of dielectric layer 14' overlapping metal posts 28, so that metal posts 28 are exposed through the openings.

Figure 18:
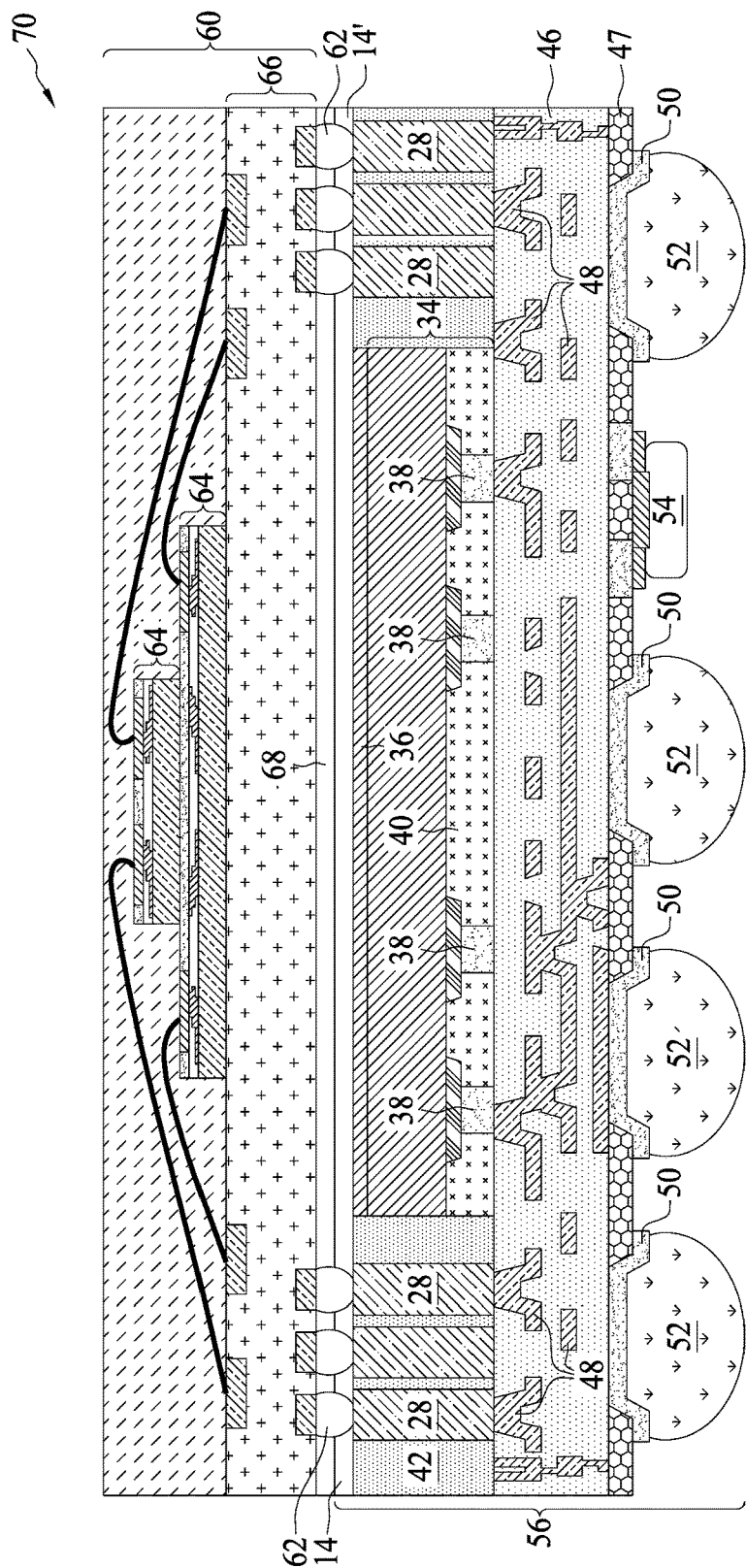

Next, as shown in FIG. 18, package 60 is bonded to metal posts 28 through solder regions 62, wherein solder regions 62 extend into the openings in dielectric layer 14'. Underfill 68 is also dispensed. Similarly, the composite wafer 56 may be sawed before or after bonding package(s) 60.

FIGS. 19 through 23 illustrate the cross-sectional views of intermediate stages in the formation of a PoP package in accordance with alternative embodiments. The embodiments shown in FIGS. 19 through 23 are similar to the embodiments shown in FIGS. 1 through 11, except the RDLs 20 as shown in FIG. 11 are not formed, while metal layer 16 as shown in FIG. 1 is formed.

Figure 19:
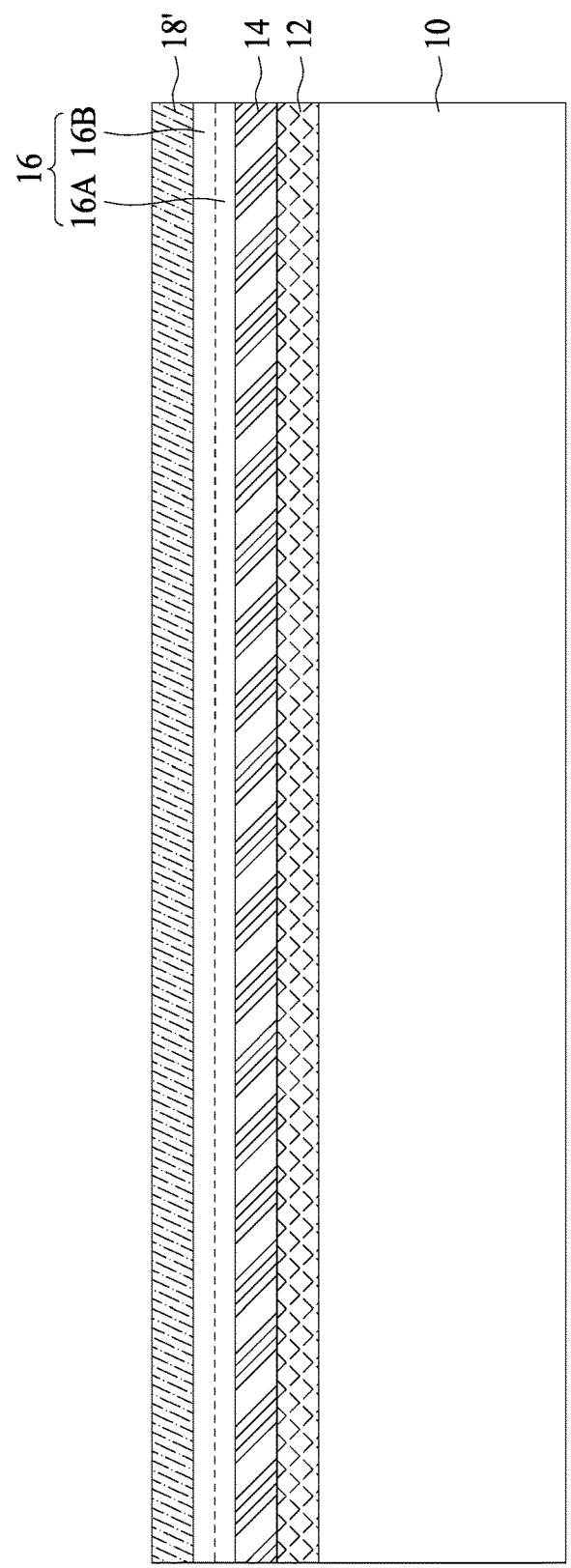
FIGS. 19 through 23 illustrate the cross-sectional views of intermediate stages in the formation of a package in accordance with some embodiments.

Referring to FIG. 19, LTHC coating 12 is formed, followed by the sequential formation of layer 14, metal layer 16, and dielectric layer 18'. In accordance with some embodiments, LTHC coating 12 includes metal particles 8 as shown in FIG. 24, or may be free from the metal particles. LTHC coating 12 and metal layer 16 both have the function of redistributing/dissipating heat in order to reduce the thermal shock suffered by carrier 10.

Figure 20:
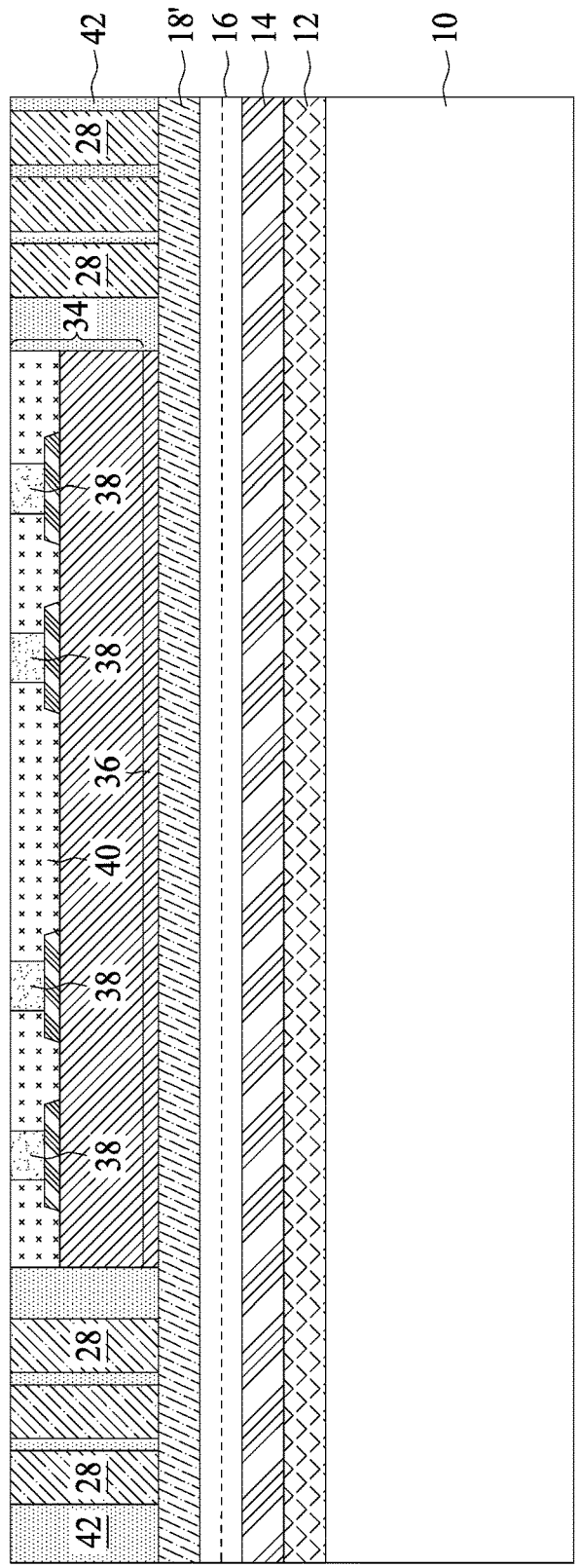
Figure 21:
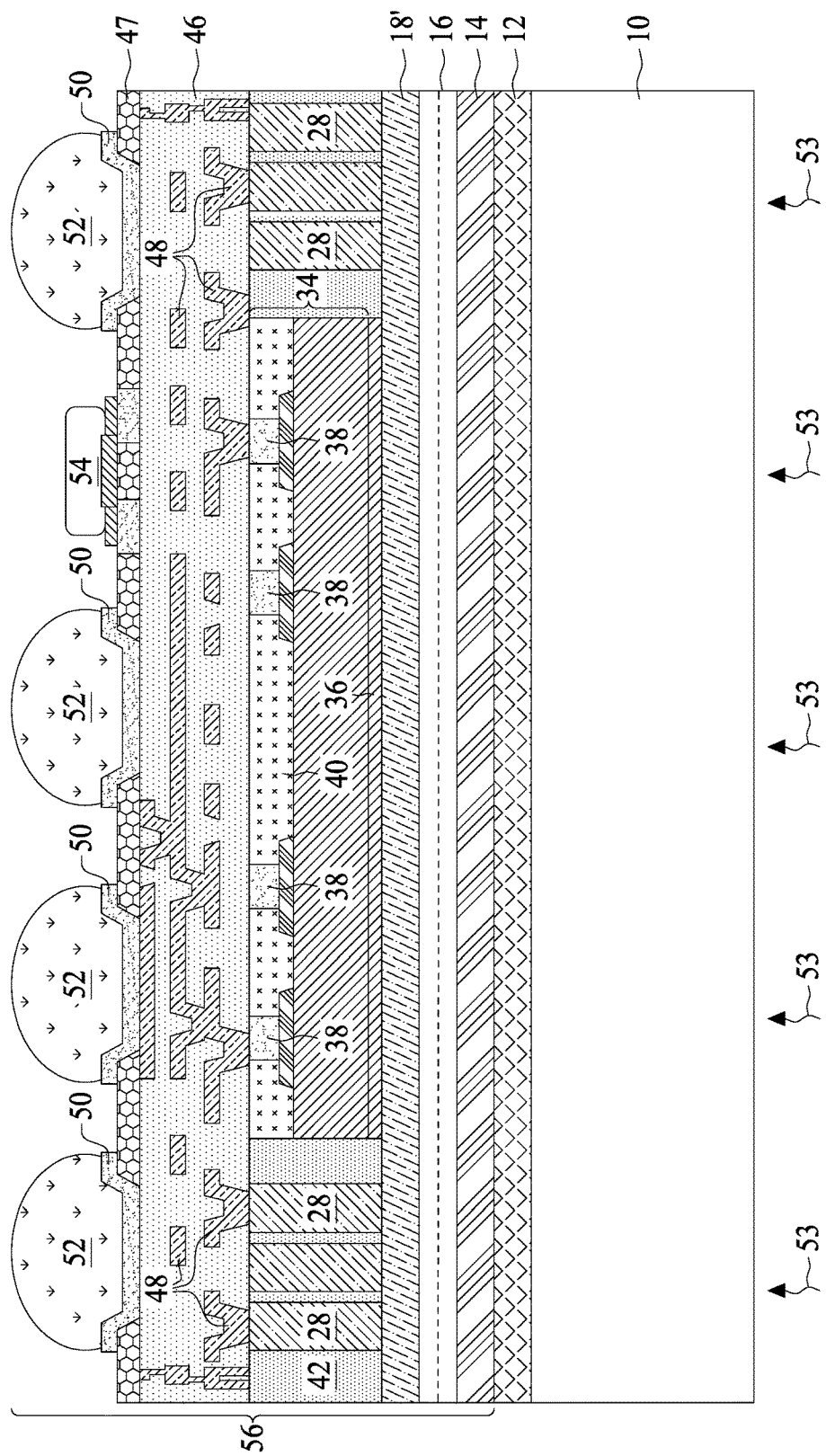

As shown in FIG. 20, metal posts 28 are formed, followed by the attachment of device die 34 and the encapsulation of device die 34 and metal posts 28 in encapsulating material 42. At a time metal posts 28 have been formed, dielectric layer 18' remains to be un-patterned, and remains as a blanket layer. FIG. 21 illustrates the formation of dielectric layers 46, RDLs 48, UBMs 50, and electrical connectors 52. Furthermore, passive device 54 is bonded. The resulting composite wafer 56 is then de-bonded from carrier 10 through the decomposition of LTHC coating 12, which is performed through laser or UV light 53. The resulting composite wafer 56 is shown in FIG. 22.

Figure 22:
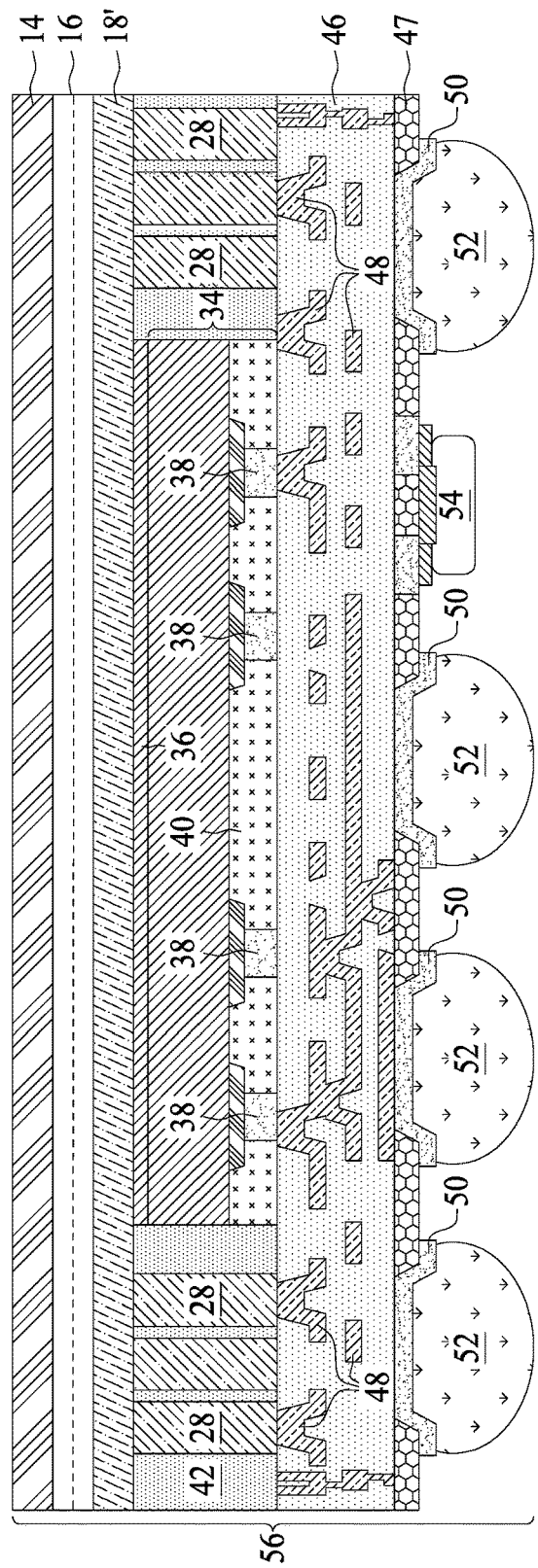
Figure 23:
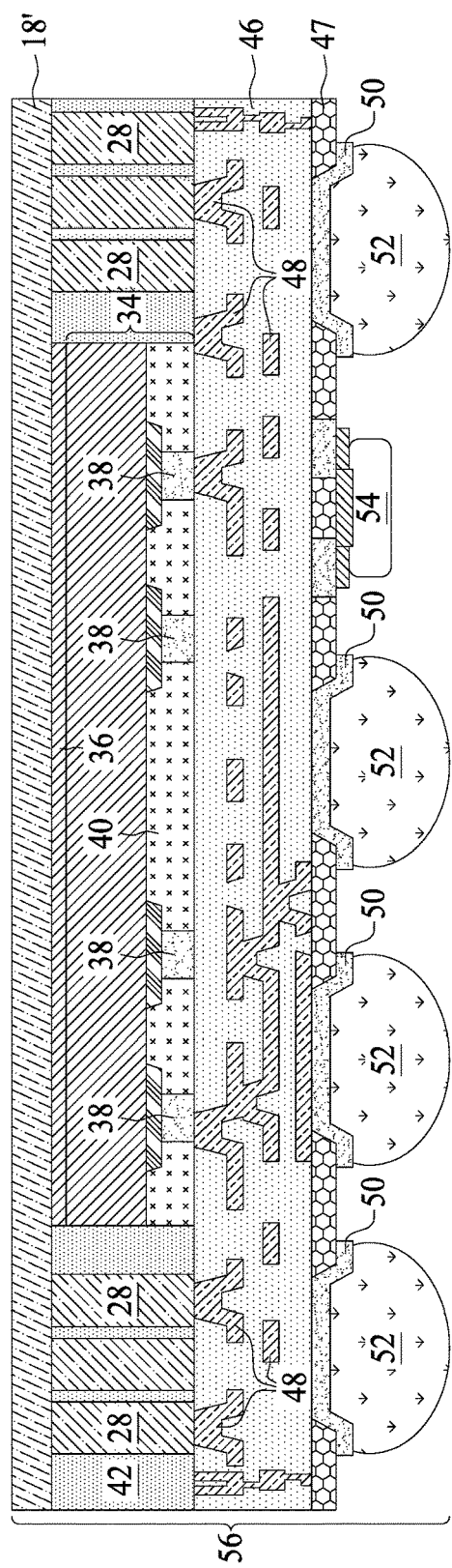

Next, dielectric layer 14 and metal layer 16 as shown in FIG. 22 are removed, for example, through etching and/or mechanical grinding. The resulting structure is shown in FIG. 23. The subsequent process steps are similar to what are discussed referring to FIG. 18, and are not repeated herein. The resulting structure is essentially the same as shown in FIG. 18.

The embodiments of the present disclosure have some advantageous features. In the packaging processes in accordance with the embodiments of the present disclosure, there is a plurality of thermal processes such as the curing of polymer layers and the curing of the encapsulating material (s). The thermal processes result in the heating and cooling of glass carrier, which suffers from chipping and cracking due to non-uniform temperature distribution. By incorporating metal particles in LTHC coating, and/or forming a metal layer over the LTHC coating, the temperature difference throughout carrier 10 may be reduced due to the increased thermal conductivity of the LTHC coating and/or the added thermal conductivity of the metal layer.

In accordance with some embodiments of the present disclosure, a method includes method includes forming a dielectric layer over a radiation de-bondable coating. The radiation de-bondable coating is over a carrier, and the radiation de-bondable coating includes metal particles therein. Metal posts are formed over the dielectric layer. A device die is attached to the dielectric layer. The device die and the metal posts are encapsulated in an encapsulating material. A plurality of redistribution lines is formed on a first side of the encapsulating material, and is electrically coupled to the device die and the metal posts. The carrier is de-bonded by projecting a radiation source on the radiation de-bondable coating to decompose the radiation de-bondable coating. Electrical connections are formed on a second side of the encapsulating material. The electrical connections are electrically coupled to the metal posts.

In accordance with some embodiments of the present disclosure, a method includes forming a blanket metal layer over a carrier, forming a dielectric layer over the blanket metal layer, forming metal posts over the dielectric layer, attaching a device die onto the dielectric layer, encapsulating the device die and the metal posts in an encapsulating material, and forming a first plurality of redistribution lines on a first side of the encapsulating material. The first plurality of redistribution lines is over and electrically coupling to the device die and the metal posts. The method further includes de-bonding the carrier from the blanket metal layer, and removing the blanket metal layer.

In accordance with some embodiments of the present disclosure, a method includes applying a sacrificial layer over a radiation de-bondable coating, The radiation de-bondable coating is over a carrier, and the radiation de-bondable coating has metal particles therein. The method further includes forming a metal layer over the sacrificial layer, forming a first dielectric layer over the metal layer, with the metal layer underlying the first dielectric layer being un-patterned, patterning the first dielectric layer to form openings, with portions of the metal layer exposed through the openings, and forming a first plurality of redistribution lines, which includes trace portions having bottom surfaces contacting a top surface of the first dielectric layer, and via portions in the openings. The method includes forming a second dielectric layer over the first plurality of redistribution lines, and forming metal posts over the second dielectric layer. The metal posts are electrically coupled to the first plurality of redistribution lines through openings in the second dielectric layer. The method further includes attaching a device die on the second dielectric layer, encapsulating the device die and the metal posts in an encapsulating material, de-bonding the carrier from the sacrificial layer by decomposing the radiation de-bondable coating, and removing the sacrificial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    coating a radiation de-bondable layer over a carrier, and the radiation de-bondable layer comprises metal particles therein;
    forming a blanket metal layer over the radiation de-bondable layer;
    forming metal posts over and electrically coupling to the blanket metal layer;
    attaching a device die over the carrier;
    encapsulating the device die and the metal posts in an encapsulant;
    de-bonding the carrier from the blanket metal layer, the metal posts, the device die, and the encapsulant; and
    patterning the blanket metal layer to form redistribution lines.

2. The method of claim 1 further comprising:
    removing the radiation de-bondable layer after the de-bonding the carrier.

3. The method of claim 2, wherein the metal particles comprise a metal selected from the group consisting of aluminum, copper, tungsten, nickel, and combinations thereof.

4. The method of claim 2 further comprising:
    forming a sacrificial dielectric layer over the radiation de-bondable layer, wherein the sacrificial dielectric layer is underlying the blanket metal layer; and
    before the patterning the blanket metal layer, removing the sacrificial dielectric layer.

5. The method of claim 4, wherein after the metal posts are formed, the sacrificial dielectric layer remains un-patterned.

6. The method of claim 1, wherein the forming the blanket metal layer comprises:
    depositing a titanium layer; and
    depositing a copper layer over the titanium layer.

7. The method of claim 1 further comprising forming additional redistribution lines over and electrically coupling to the redistribution lines.

8. A method comprising:
    forming a first dielectric layer over a carrier;
    forming a blanket metal layer over the first dielectric layer;
    forming a second dielectric layer over the blanket metal layer;
    forming metal posts over the second dielectric layer;
    encapsulating the metal posts in an encapsulant;
    forming a first plurality of redistribution lines on a first side of the encapsulant, wherein the first plurality of redistribution lines are over and electrically coupling to the metal posts;
    de-bonding the carrier from the blanket metal layer; and
    etching the blanket metal layer.

9. The method of claim 8 wherein the first dielectric layer is a blanket layer when the metal posts are formed over the second dielectric layer, and the method further comprises removing the first dielectric layer.

10. The method of claim 8, wherein the etching the blanket metal layer results in a second plurality of redistribution lines to be formed and electrically coupling to the first plurality of redistribution lines through the metal posts.

11. The method of claim 8, wherein the etching the blanket metal layer results in an entirety of the blanket metal layer to be removed.

12. The method of claim 8 further comprising:
    coating a radiation de-bondable coating over the carrier, wherein the radiation de-bondable coating comprises metal particles therein, and the de-bonding the carrier comprises decomposing the radiation de-bondable coating.

13. The method of claim 12, wherein the decomposing is achieved by project laser beam on the radiation de-bondable coating.

14. The method of claim 8, wherein the forming the blanket metal layer comprises:
    depositing a titanium layer; and
    depositing a copper layer over the titanium layer.

15. A method comprising:
    forming a blanket metal layer over a carrier;
    forming a first dielectric layer over the blanket metal layer;

forming a first plurality of redistribution lines comprising:
  trace portions having bottom surfaces contacting a top surface of the first dielectric layer; and
  via portions extending into the first dielectric layer to contact the blanket metal layer;
forming a second dielectric layer over the first plurality of redistribution lines;
attaching a device die onto the second dielectric layer;
encapsulating the device die in an encapsulant;
de-bonding the carrier from the blanket metal layer; and
patterning the blanket metal layer to form a plurality of RDLs.

16. The method of claim 15 further comprising:
applying a radiation de-bondable coating over the carrier, wherein the radiation de-bondable coating comprises metal particles therein, wherein the de-bonding the carrier comprises projecting a laser beam to decompose the radiation de-bondable coating; and
forming a sacrificial layer over the radiation de-bondable coating, wherein the sacrificial layer is underlying the blanket metal layer.

17. The method of claim 16 further comprising removing the sacrificial layer.

18. The method of claim 16 further comprising mixing metal particles into a base material to form the radiation de-bondable coating.

19. The method of claim 15, wherein at a time after the first plurality of redistribution lines are formed, the blanket metal layer remains to be un-patterned.

20. The method of claim 15, wherein the forming the blanket metal layer comprises:
depositing a titanium layer; and
depositing a copper layer over the titanium layer.

* * * * *